United States Patent [19]
Edge et al.

[11] Patent Number: 5,742,512
[45] Date of Patent: Apr. 21, 1998

[54] ELECTRONIC ELECTRICITY METERS

[75] Inventors: Ellen D. Edge, Portsmouth; Roland J. Provost, Dover, both of N.H.; Thomas Maehl, Philadelphia, Pa.; Gregory P. Lavoie, Lee, N.H.; Mark J. Plis, Barrinton, N.H.; Mark E. Hoffman, Rochester, N.H.; John E. Hershey, Ballston Lake, N.Y.

[73] Assignee: General Electric Company, New York, N.Y.

[21] Appl. No.: 565,464

[22] Filed: Nov. 30, 1995

[51] Int. Cl.$^6$ .......................... G08B 21/00; G06F 17/00
[52] U.S. Cl. ............................... 364/480; 340/687
[58] Field of Search ................................. 364/480, 483, 364/464.04, 464.02, 132; 324/103 R, 110, 133; 340/635, 637, 870.01, 870.02, 825.54, 652, 654, 687; 395/112, 165; 439/489

[56] References Cited

U.S. PATENT DOCUMENTS

| | | | |
|---|---|---|---|
| 5,270,958 | 12/1993 | Dastous | 364/569 |
| 5,304,987 | 4/1994 | Brunson et al. | 349/654 |
| 5,428,351 | 6/1995 | Lee, Jr. et al. | 340/870.02 |
| 5,521,586 | 5/1996 | Takeshita | 340/635 |
| 5,537,029 | 7/1996 | Hemminger et al. | 324/142 |
| 5,537,333 | 7/1996 | Hemminger et al. | 364/492 |
| 5,544,089 | 8/1996 | Hemminger et al. | 364/492 |
| 5,548,527 | 8/1996 | Hemminger et al. | 364/492 |
| 5,555,508 | 9/1996 | Munday et al. | 364/492 |

OTHER PUBLICATIONS

ABB Alpha Keys, Aug. 1993.
ABB Alpha Meter—Technical Specification for Electronic Meters, 14 Jan. 1993.

Primary Examiner—Emmanuel T. Voeltz
Assistant Examiner—Tony M. Cole
Attorney, Agent, or Firm—Carl B. Horton; John Beulick

[57] ABSTRACT

An electronic energy meter is described. The meter includes, in one form, voltage and current sensors having their outputs coupled to an analog to digital converter. The digital signals output by the converter are supplied to a digital signal processor (DSP) which outputs digitized metering quantities to a microcomputer. Using the metering quantities supplied by the DSP, the microcomputer performs additional metering calculations and functions. In one aspect, the present invention is directed to a method for determining whether an option board is being used and, if so, controlling meter operations in accordance with the coupled option board.

In another aspect, the present invention is directed to a high function option board which, when enabled, operates as a master and the meter microcomputer automatically switches from its normal master mode to slave mode. In yet another aspect, the present invention is directed to converting the functionality of the electronic electricity meter from a first mode of operation to a second mode of operation. In still another aspect, the present invention is directed to a structure for avoiding, or minimizing, the loss of billing data when converting, or upgrading (or downgrading), meter operations.

19 Claims, 3 Drawing Sheets

ELECTRONIC ELECTRICITY METERS

FIELD OF THE INVENTION

This invention relates generally to electricity metering and more particularly, to an electronic electricity meter.

BACKGROUND OF THE INVENTION

Known electronic electricity meters typically include a meter integrated circuit (IC) and a register IC. Each IC may include a processor controlled by a program stored in the IC memory. In order to change, or upgrade, the register IC functionality, the program stored in the register IC memory typically is erased and replaced by a new program.

In known electronic electricity meters, when a function upgrade requires the addition of hardware rather than just a software change, an option board may be attached to the meter. The option board typically is configured to communicate with the register IC and performs certain well known functions, such as a demand threshold alert, a power factor alert, and load control.

The register IC typically must be reprogrammed to both communicate with the option board and to perform some added functions required by the option board. As described above, reprogramming the register IC typically requires erasing the old program and loading the new program in the register memory. Since the new program typically is not implemented in all the meters, both the new program and the old program must be maintained. Of course, having to maintain two programs increases costs and the possibility for errors. Also, since many users do not reprogram a meter at the installation site, or use specially trained personnel for reprogramming, additional costs are generally associated with reprogramming meters. The cost associated with developing and implementing new programs can, in some instances, be prohibitive and may limit the number of upgrades performed, even though such upgrades are desired and beneficial.

In addition to the more well known types of upgrades implemented in option boards, e.g., demand threshold alert, power factor alert, and load control, some users desire to have the ability to upgrade a meter to execute certain high function energy consumption and quality calculations, and to store the results for later retrieval or communicate the results via a communications network. These desired functions generally have processing requirements beyond the usual option board upgrades currently available.

In addition, some users desire to have the ability to convert installed meters from operating in one mode to operating in another mode. For example, although a meter may be initially installed to perform demand only functions, the user may later desire to convert the same meter to perform time of use functions. Such convertible meters which can be altered to execute different modes of metering are known.

With known convertible meters, however, as part of the conversion process, and in converting from a demand only to a time of use meter, the register IC is first unprogrammed and the measured data is erased. The register IC is then programmed to execute time of use functions. Of course, losing the measured data when performing the conversion is undesirable.

Further, with respect to known convertible meters, some users do not want to pay for the increased meter functionality at the time the meter is purchased. More specifically, even though a user may purchase a convertible meter, the meter may be installed and operate as a demand only meter. Since the user is not operating the meter as, for example, a time of use meter, the user generally does not want to have to purchase the meter at a time of use meter price. Rather, since the user intends to initially use the meter in the demand only mode, the user typically prefers to only have to pay for the demand only functionality.

It would be desirable to provide an electronic electricity meter which does not require reprogramming, or a completely new program, when upgrading the functionality of the meter using an option board. In addition, it would be desirable to provide a meter which can be easily and quickly upgraded to operate as a high function meter. Further, it would be desirable to provide a convertible meter which is both low in cost and does not lose measured data upon conversion.

SUMMARY OF THE INVENTION

These and other objects may be attained in an electronic energy meter which, in one form, includes, voltage and current sensors having their outputs coupled to an analog to digital converter. The digital signals output by the converter are supplied to a digital signal processor (DSP) which outputs digitized metering quantities, e.g., $V^2H$, $I^2H$, to a microcomputer. Using the metering quantities supplied by the DSP, the microcomputer performs additional metering calculations and functions.

In one aspect, the present invention is directed to a method for determining whether an option board is being used and, if so, controlling operations in accordance with the coupled option board. More specifically, the processing steps executed by the DSP and the microcomputer in connection with each option board are preloaded into the memory of meter, regardless of whether such option boards are included with the meter at the time of delivery. Upon power up, the microcomputer checks a status indicator to determine whether a possible option board has been connected to the meter and if so, the microcomputer is automatically reinitialized to execute the option board functions for the subject board. Such a configuration avoids the time and expense associated with reprogramming the meter at the meter shop or having to send a specially trained individual to the meter site to perform the reprogramming.

In another aspect, the present invention is directed to a high function option board which, when enabled, operates as a master and the meter microcomputer automatically switches from its normal master mode to a slave mode of operation. The functions performed by a high function board may be selected by the user and may vary depending upon the particular functionality desired. Since users do not have to reprogram the meter, or use specially trained personnel for reprogramming, even when installing the high function board, costs associated with installing such high function boards are believed to be significantly reduced. In addition, by automatically converting microcomputer operations to the predefined slave mode when a high function board is installed and enabled, many different high function boards performing many different functions and operations can be designed and implemented without having to reconfigure the meter. Such structure provides a user with a great amount of flexibility.

In yet another aspect, the present invention is directed to converting the functionality mode of the electronic electricity meter. More specifically, and in accordance with one form, the meter is assigned a unique 16 byte serial number.

The serial number is used in conjunction with an upgrade number to generate a set of encrypted passwords unique to each upgrade and to each meter. One password is generated for each upgradable option based on the meter serial number, option number, and software encryption key. All the passwords are written to read protected memory locations in the meter. The serial number and bit-flags indicating enabled upgrades are stored in the meter non-volatile RAM.

An "upgrade command" is established in the meter communication protocol that defines the communication methodology between the meter (e.g., the meter microcomputer) and an external computer via the optical port. A hardware key, having a software encryption key and upgrade counters, also is configured to be electronically coupled to the external computer, e.g., via a parallel port. The external computer, using the information from the meter and hardware key, generates a password and transmits the password to the meter microcomputer. If the transmitted password matches a prestored password, then the meter functionality is automatically converted to the functionality specified.

By enabling an upgrade, or conversion, of a meter as described above, users do not necessarily pay the full cost for increased meter functionality at the time the meter is purchased. More specifically, even though a user may purchase a convertible meter, the meter may be installed and operate as a demand only meter. When the user desires to upgrade the meter functionality, the user may then purchase the hardware key and use such key to perform the upgrade. The user may therefore realize a cost savings by not paying for the extra meter functionality until such functionality is needed.

In still another aspect, the present invention is directed to a structure for avoiding, or minimizing, the loss of billing data when converting, or upgrading (or downgrading), meter operations. This result is achieved by storing cumulative billing information in a meter EEPROM. More specifically, for all modes of operation, each section of the EEPROM is designated to store specific types of information. Regardless of the mode of operation, the EEPROM section assignments do not substantially change. When a mode change occurs, the same information continues to accumulate in the respective assigned EEPROM sections. With such a structure, rather than erasing the measured data, the data simply continues to accumulate in the assigned sections.

The electronic electricity meter described above does not require reprogramming, or a completely new program, when upgrading the functionality of the meter using an option board. In addition, the meter can be easily and quickly upgraded to perform as a high function meter. Further, the convertible meter does not lose measured data upon conversion and the user does not necessarily pay for the full cost for all meter functionality until the convertible meter is actually converted to perform the desired functions.

DETAILED DESCRIPTION OF THE DRAWINGS

The following detailed description includes five sections. The first section describes the basic hardware of an electronic energy meter. The second section describes option board detection. The third section describes high function option boards. The fourth section describes converting functionality of the meter. The fifth section describes preserving measured data even after meter conversion.

Electronic Energy Meter Hardware

Figure 1:
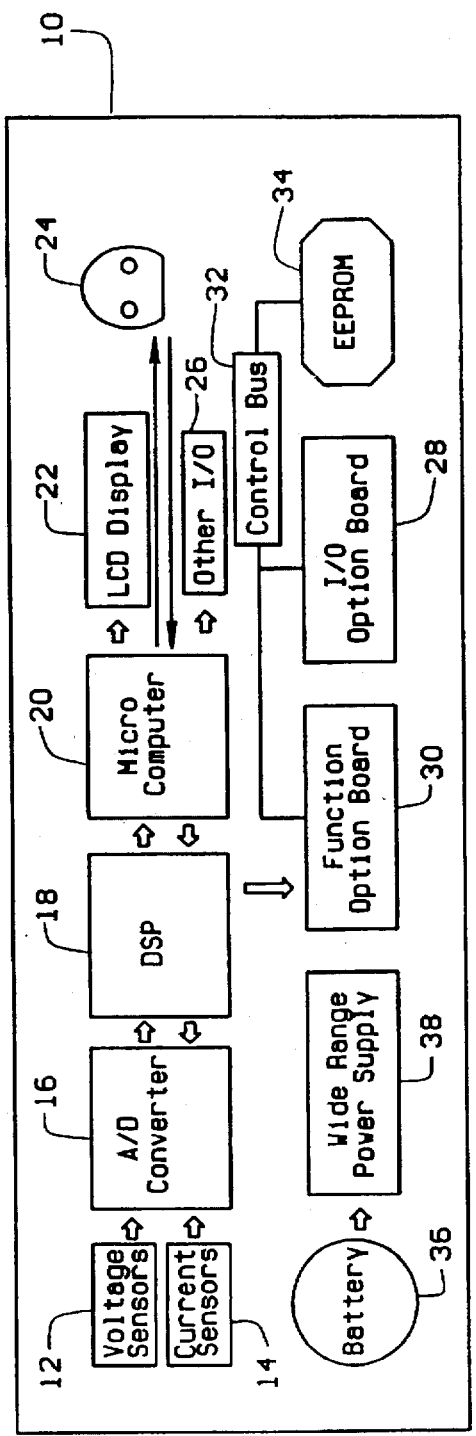
FIG. 1 is a block diagram of an electronic energy meter.

FIG. 1 is a block diagram illustration of an electronic energy meter 10. As shown in FIG. 1, meter 10 includes voltage sensors 12 and current sensors 14. Sensors 12 and 14, in operation, typically are coupled to the power lines supplying power to site at which the meter is located. Sensors 12 and 14 are coupled to an analog to digital (A/D) converter 16 which converts the input analog voltage and current signal to digital signals. The output of converter 16 is provided to a digital signal processor (DSP) 18. DSP 18 supplies microcomputer 20 with digitized metering quantities, e.g., $V^2H$, $I^2H$. Microcomputer 20, using the metering quantities supplied by DSP 18, performs additional metering calculations and functions. DSP 18 may, for example, be a processor commercially available as Model Number TMS320 from Texas Instruments Company, P.O. Box 6102, Mail Station 3244, Temple, Tex. 76503, modified to perform metering functions.

Microcomputer 20 is coupled to a liquid crystal display 22 to control the display of various selected metering quantities and to an optical communications port 24 to enable an external reader to communicate with computer 20. Port 24 may be the well known OPTOCOM™ port of General Electric Company, 130 Main Street, Somersworth, N.H. 03878, which is in accordance with the ANSI type II optical port. Microcomputer 20 may also generate additional outputs 26 used for various other functions as is well known in the art. Microcomputer 20 may, for example, be an eight bit microcomputer commercially available from Hitachi America, Inc., Semiconductor & I.C. Division, Hitachi Plaza, 2000 Sierra Point Parkway, Brisbane, Calif. 94005-1819, modified to perform metering functions.

Microcomputer 20 also is coupled to an input/output (I/O) board 28 and to a function, or high function, board 30. DSP 18 also supplies outputs directly to high function board 30. Computer 20 further is coupled, via a control bus 32, to an electronically erasable programmable read only memory (EEPROM) 34. I/O board 28 and high function board 30 also are coupled, via bus 32, to EEPROM 34.

Back-up power is supplied to the meter components described above by a battery 36 coupled to a wide range power supply 38. In normal operation when no back-up power is required, power is supplied to the meter components from the power lines via power supply 38.

Many functions and modifications of the components described above are well understood in the metering art. The present application is not directed to such understood and known functions and modifications. Rather, the present application is directed to the methods and structures described below in more detail. In addition, although the methods and structures are described below in the hardware environment shown in connection with FIG. 1, it should be understood that such methods and structures are not limited to practice in such environment. The subject methods and structures could be practiced in many other environments.

Option Board

As described in connection with FIG. 1, I/O board 28 and high function option board 30 may optionally be coupled to microcomputer 20 to form a part of meter 10. In one aspect, the present invention is directed to a method for determining whether an option board is properly connected to microcomputer 20 and forming a part of meter 10. If such an option board is present, then the functionality of microcomputer 20 is changed, as required, to enable option board operation.

More specifically, the processing steps executed by DSP 18 and microcomputer 20 in connection with each respective allowed option boards is preloaded into the memory of meter, regardless of whether such option boards are included with the meter at the time of delivery. Option boards that may be used in connection with meter 10 may be generally categorized as simple input/output, load profile/self read memory, and high function option boards. The aspect of the present invention described in this section relates specifically to detecting the presence of an option board. This aspect of the present invention is not directed to the general structure and function of the option boards themselves, e.g., performing load control, nor to the subsequent metering processing performed by DSP 18 and microcomputer 20. Rather, this aspect of the invention is specifically directed to overcoming the shortcomings associated with known electronic electricity meters which must be reprogrammed with a new program when an option board is connected to, and forms a part of, the meter. As explained above, by avoiding the reprogramming operations, the cost and time required for implementing option boards is believed to be significantly reduced.

Figure 2:
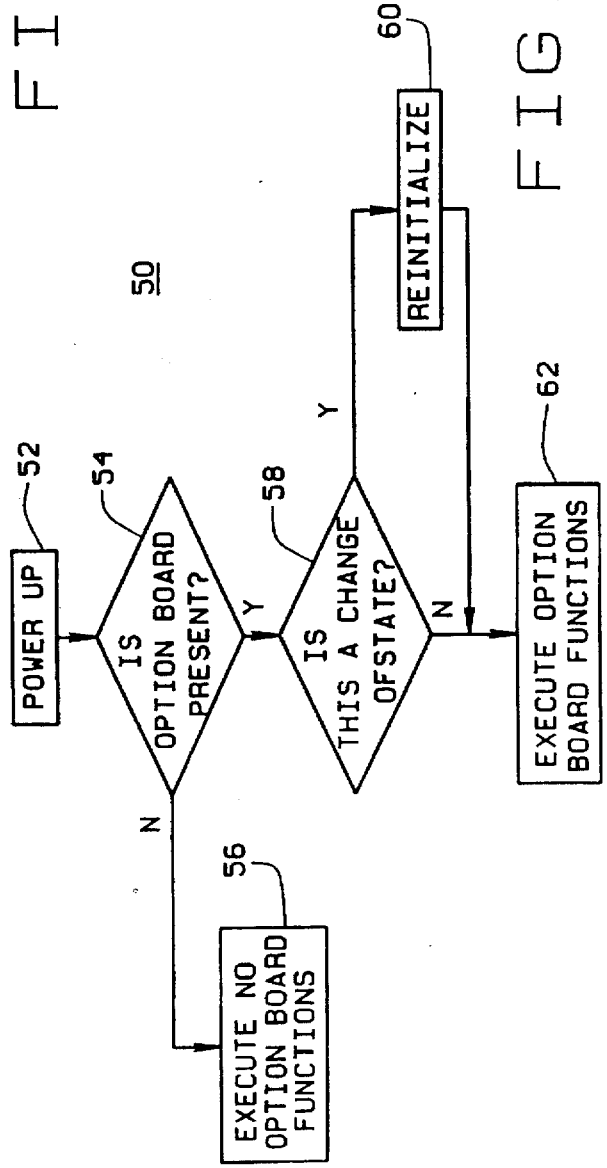
FIG. 2 is a flow chart illustrating a sequence of process steps for configuring meter program execution based on the presence of an option board.

More specifically, and referring to FIG. 2, a flow chart 50 illustrating a sequence of process steps in accordance with the one aspect of the present invention is described. As shown in FIG. 2, and after power up 52 of the meter, microcomputer 20 is controlled to determine whether an option board is present 54.

For example, with a simple input/output board, the presence of such an option board can be detected by checking the status of a designated pin having a low state when no option board is connected thereto and a high state when an option board is connected thereto. Examples of simple input/output option board functions include the following functions.

Demand Threshold Alert

Power Factor Alert

Diagnostic Error Alert

Rate Alerts (TOU only)

End Of Interval Indicator

Load Control

Real Time Pricing active

For a load profile/self read memory boards, the presence of such an option board can be determined in the same manner as described above with respect to is checking the status of a designated pin. The pin designated for the simple input/output boards would be different from the pin designated for load profile/self read option boards. In addition, and with such a board, microcomputer 20 outputs an acknowledgement request on the designated pin and awaits, for a predesignated time period, a return acknowledgement to detect the presence of on-board memory.

For a high function board, the presence of such an option board can also be determined in the same manner as described above with respect to checking the status of a designated pin. The pin designated for the simple input/ output boards and the pin designated for the load profile/self read memory boards would be different from the pin designated for a high function boards. Also, and with a high function board, microcomputer 20 would be controlled to output an acknowledgement request on the designated pin and awaits, for a predesignated time period, a return acknowledgement to detect the presence of on-board memory.

With a high function board, it also is contemplated that such board would not be rendered active until enabled via a signal transmitted to such board via optical port 24. Therefore, even if a high function board is present, the functionality of microcomputer 20 would not be altered until such board also is enabled.

If no option board is detected, then no option board functions are executed by meter 10. If an option board is detected, and enabled as required, microcomputer 20 then determines whether this is a change of state from the last power up 58. If it is a change of state, then microcomputer 20 is reinitialized 60 to execute the functions required by the newly connected, or enabled, option board. Microcomputer 20 then continues operations by executing the option board functions 62 in addition to its other functions.

As explained above, by preloading the processing steps, or routines, to be executed by microcomputer 20 into the meter memory regardless of whether the option board is included at the time of delivery, and then enabling such routines when the presence of such an option board is detected at power up, a substantial savings is believed to be realized by avoiding the costs and time required to reprogram a meter at the meter shop or by a specially trained individual. Such savings are believed to more than offset the additional memory required to store such routines and the time required to initially load such routines into memory at the factory.

High Function Option Boards

Figure 3:
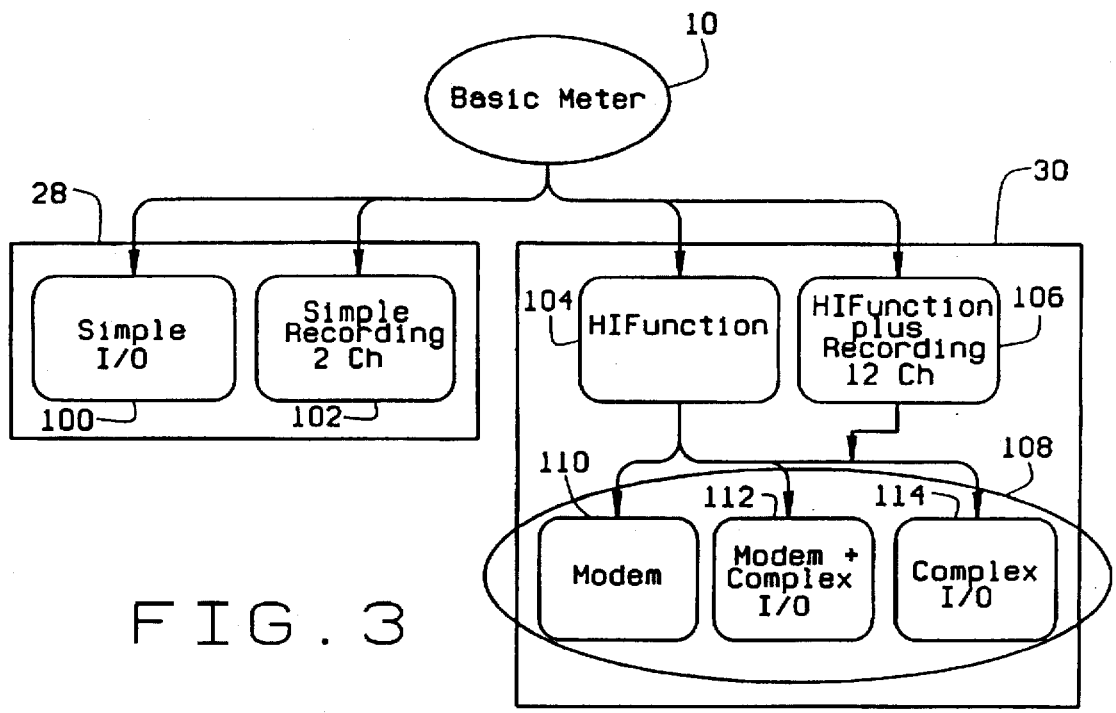
FIG. 3 is a block diagram illustrating connectivity of option boards to an electronic electricity meter.

FIG. 3 illustrates simple option boards 28 and high function option boards 30 coupled to electronic electricity meter 10. The simple option board types include simple input/output boards 110 and simple recording boards (two channels) 102 as shown. Such simple option boards 28 are separate and stackable, as is well known.

High function boards (HFBs) 30, as shown in FIG. 3, may be only high function boards 104 or high function boards including recording capability (e.g., EEPROM) for twelve channels 106. High function boards 104 and 106 are configured to be coupled to communicating boards 108 such as a modem board 110, a modem board with a complex input/output 112, or complex input/output boards 114. High function boards 30 and communicating boards 108 also are stackable.

Figure 4:
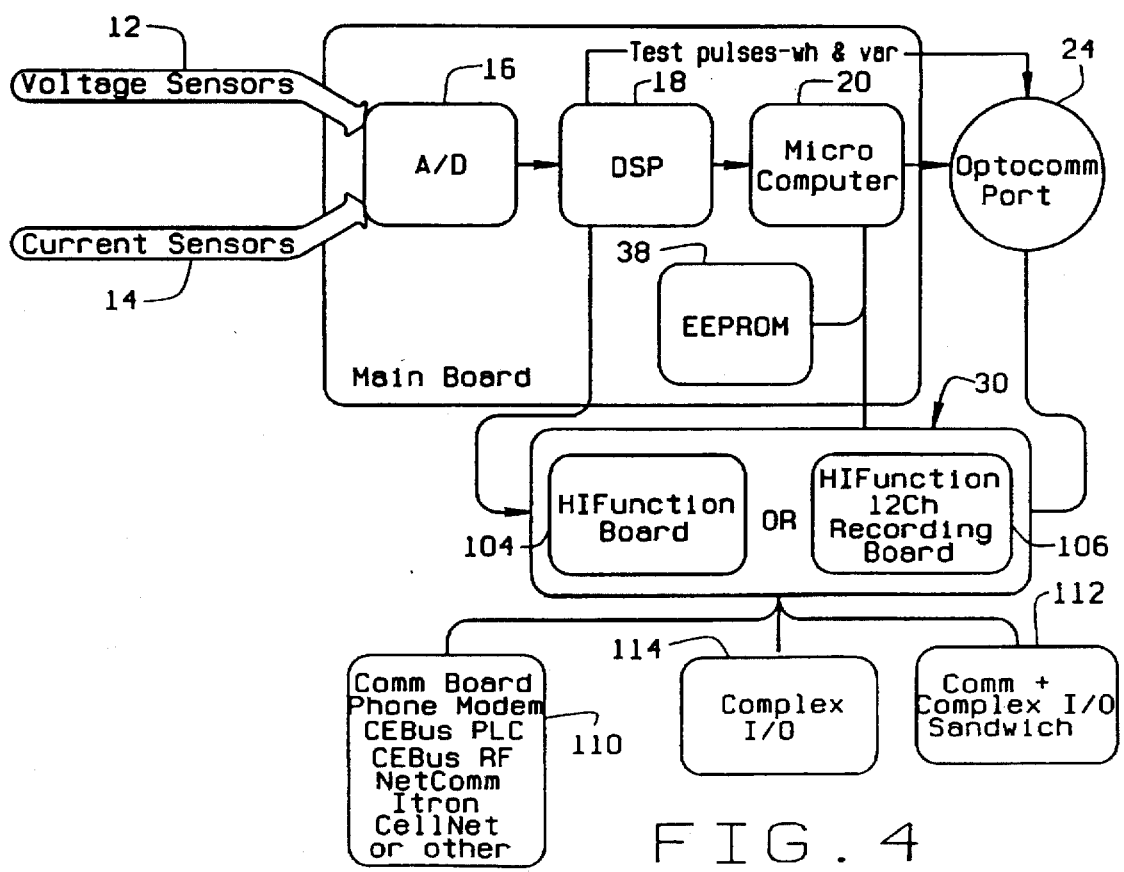
FIG. 4 is a more detailed block diagram illustrating connectivity between high function option boards and communications boards with respect to the main processing board of an electronic electricity meter.

With respect to high function boards 30, the connectivity between such boards 30 and metering board components is shown in FIG. 4. The same reference numerals used to designate components in FIG. 1 are used for the same components shown in FIG. 4. As shown in FIG. 4, both types of high function boards 104 and 106 receive outputs from DSP 18, microcomputer 20, and from the optical communications port 24, which may be the well known Optocom type port. As an example, with respect to DSP 18 and for a high function board which performs a waveform capture operation, such a high function board would receive signals from DSP 18 regarding volts and amperes per element or phase. Also, both types of high function boards 104 and 106 may be coupled to the various types of communication boards 110, complex input/output boards 114 and combination boards 112.

With respect to operations, if a high function board 30 is detected as described in the section above, and if the HFB is enabled, e.g., by signals transmitted via optical port 24, microcomputer 20 switches from its normal master mode to a slave mode of operation. Of course, the functions performed by a high function board may be selected by the user and may vary depending upon the particular functionality desired. This application is not directed to the functionality performed by the high function board. Rather, this application is directed, in one aspect, to detecting the presence of a high function board as described in the section above and automatically switching microcomputer 20 to the slave mode of operation in the presence of such an enabled high function board.

More specifically, during slave mode of operation, microcomputer 20 performs at least the following tasks.

1. LCD Driver functions.
2. Button Press and Switch Activation Detection.
3. Internal Crystal Timekeeping.
4. Battery Timekeeping.

In addition, in the slave mode of operation, EEPROM 34 retains its configuration and calibration constants. HFBs, as an example, may reset the meter, read/write from an allotted area in a simple input/output board, execute a procedure from the meter ROM or from the downloaded data from the meter RAM.

Since users do not reprogram the meter at the installation site, or use specially trained personnel for reprogramming, even when installing a high function board, costs associated with installing such high function boards are believed to be significantly reduced. In addition, by automatically converting microcomputer 20 to the slave mode when a high function board is installed and enabled, many different high function boards performing many different functions and operations can be designed and implemented without having to reconfigure the meter. This allows a user a great amount of flexibility and reduces costs.

Converting Meter Operation

Converting meter operation refers to enabling a user to selectively operate the meter in different metering modes, such as selectively operating a meter either a time of use (TOU) or demand metering mode. Specifically, and as described below in more detail, a user can convert meter operation from a demand only mode to a time of use mode, for example. In one form, the meter has three different modes. These modes are the demand only mode, the demand with load profile mode (sometimes referred to in the art as the demand with timekeeping mode), and the TOU mode. A battery, as is well known, is used in connection with demand with load profile and TOU modes.

In general, and in accordance with one aspect of the present invention, a two step security system is implemented to control the quantity of meters a user can upgrade. Particularly, in order to convert, or upgrade, a meter, the user first purchases a hardware "Key" device that attaches to the parallel port of an external computer, e.g., a laptop computer. The hardware key is a pass-through device that contains multiple counters and an encryption key. The counters are utilized to control the number of meters that can be upgraded. One counter is assigned to each upgradable option. A meter will not be upgraded unless the key is present and contains a valid number of counts for the requested upgrade, as described below.

It is contemplated that the user would purchase the hardware key from the manufacturer. Each time the contents of a hardware key are changed, the key serial number, counter data, and software encryption key are read back from the hardware key, displayed to the user, and appended to a database table. By reading this information from the hardware key, errors or failures in the software or hardware can be identified. The following information is stored in the database table.

| Key Table: | |
|---|---|
| ReqNum | Requisition Number [x bytes] (user entered) |
| CustName | Customer Name [x characters] (user entered) |
| SerialNumber | Key serial number (automatically generated or read from key) |
| KeyType | Key type (user selected) |
| Date | Date of key creation (automatically generated) |
| Time | Time of key creation (automatically generated) |
| EncryptKey | Encryption key value (hard code to random value) |
| Upgrade Table: | |
| UpgradeNumber | Number of the upgrade [1 byte] (user selected) |
| UpgradeCount | Upgrade counter value [2 bytes] (user entered) |
| Key Name Table: | |
| KeyType | Key type number |
| KeyName | Key name (ASCII field identifying name of key type) |
| Upgrade Name Table: | |
| UpgradeNumber | Upgrade number |
| UpgradeName | Upgrade name (ASCII field identifying name of upgrade) |

Known hardware keys include the Sentinal SuperPro commercially available from Rainbow Technologies, 50 Technology Drive, Irvine, Calif. 92718, and Model Number DS1425, commercially available: from Dallas Semiconductor, 4401 South Beltwood Parkway, Dallas, Tex. 75244-3292.

In addition, each meter is assigned a unique 16 byte serial number. The serial number and bit-flags indicating which options have been enabled are stored in the meter nonvolatile RAM. An "upgrade command" is established in the protocol that defines communication between the meter (microcompute 20) and the external computer via optical port 24 (FIG. 1). The serial number is used in conjunction with an upgrade number to generate a set of encrypted passwords unique to each upgrade and to each meter. One password is generated for each upgradable option based on the meter serial number, option number, and encryption key. All the passwords are stored in read protected memory locations in the meter. Each password consists, for example, of a 4 byte binary value.

The present application is not directed to any specific encryption algorithm. It is contemplated that many different encryption algorithms could be used to generate an encrypted message in a manner acceptable for metering data security and integrity.

With respect to selecting a metering mode of operation at the factory, a command line interface may be used in the factory to enable upgrades in meters on the manufacturing assembly line. Such interface should operate rapidly to avoid slowing production and accept arguments such as "/U1", "/U2", "/U3", "Un" for upgrades 1, 2, 3, . . , n respectively.

Figure 5:
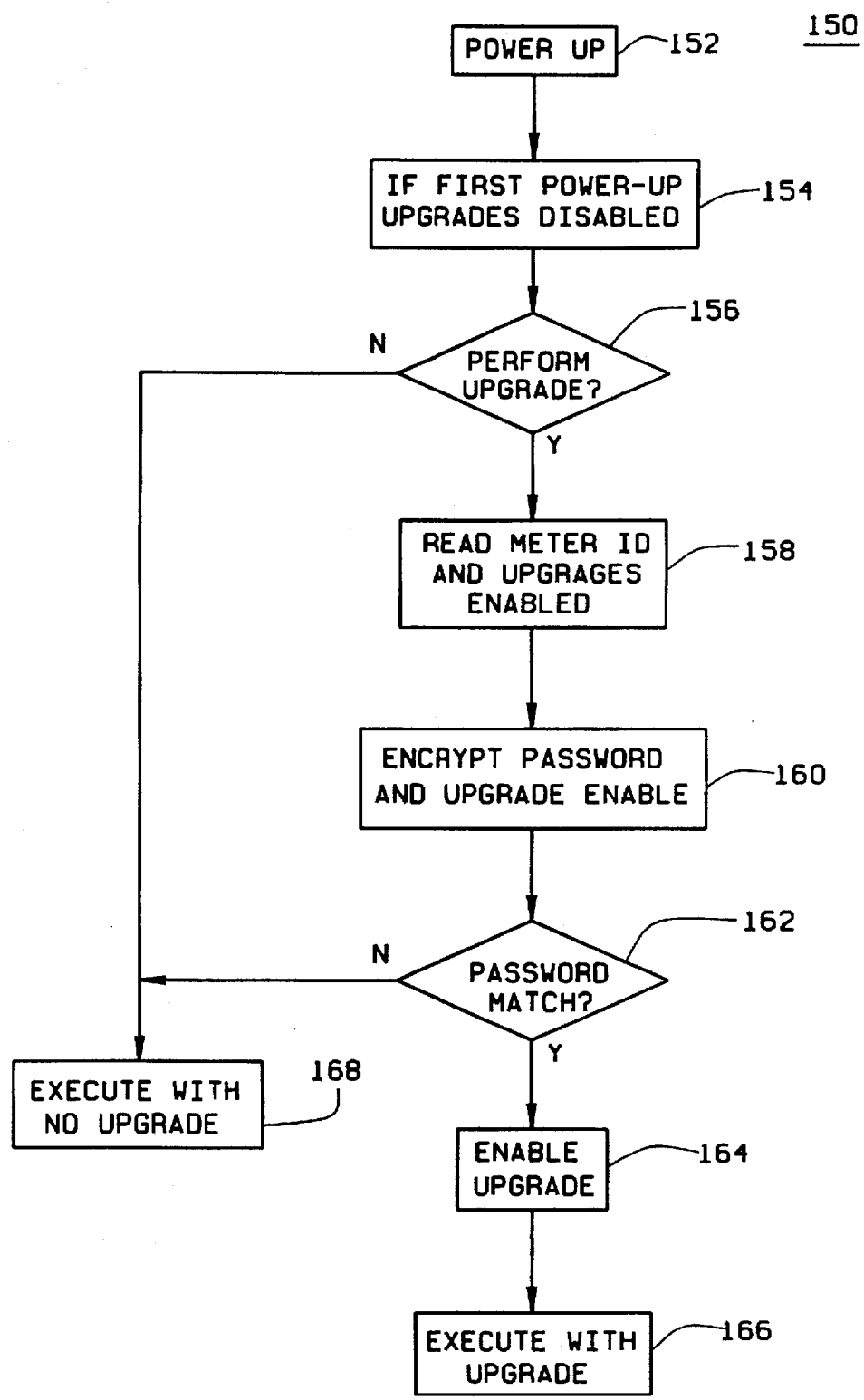
FIG. 5 is a flow chart illustrating a sequence of process steps for performing a convertibility and upgrade function in an electronic electricity meter.

Referring specifically to FIG. 5, a flow chart 150 illustrates a sequence of process steps for customer conversion of a meter. More specifically, upon power up 152 of the meter for the first time, all upgrades are disabled 154 in the meter. If an upgrade is to be made 156, the external computer processor is coupled to meter microcomputer 20 via optical port 24 (FIG. 1) and the hardware key is coupled to the parallel port of the external computer. If the hardware key is valid for the connected meter, i.e., the encryption key is correct and at least one upgrade count is available on the key, a menu of options is displayed to the user at the external computer. The menu provides the following options.

| | |
|---|---|
| Option I | CheckMeter - Causes the software to read and display the current upgrade status of a meter. |
| Option II | InstallUpgrade - Upgrade the meter. |
| Option III | RemoveUpgrade - Remove an upgrade from the meter. This is a hidden option, visible only if the UserName that matches a correct password. If this option is invoked, a large warning message and "Proceed? Y/N" prompt appears indicating that the process is not reversible and that the key in the meter will be lost. |
| Option IV | RecheckKey - Causes the software to check again for a hardware key. |

If the user chooses "InstallUpgrade", the encryption key is read from the hardware key, and the serial number and upgrade status is read from the meter memory 158. The meter serial number, hardware, and firmware revisions, meter type, meter mode, and the status of each of the upgrade flags in the meter are then displayed.

The user then selects which type of upgrade to perform, and based on this selection, the external computer operates to combine the serial number, upgrade number, and encryption key into an encrypted 4 byte password 160 which is then sent to the meter via the optical port. The meter compares the password with the stored password. If the passwords match 162, the upgrade is enabled 164 and processing proceeds with execution of the upgraded functionality 166. If no match is made, no upgrade is made 168.

If the meter is successfully upgraded, the hardware key counter is decremented. Decrementing of the key should be done as quickly as possible after upgrading the meter. The user is then informed as to the status of the upgrade and the communications session with the meter is terminated.

By enabling upgrading, or conversion, of a meter as described above, users do not necessarily pay the full cost for increased meter functionality at the time the meter is purchased. More specifically, even though a user may purchase a convertible meter, the meter may be installed and operate as a demand only meter. When the user desires to upgrade the meter functionality, the user may then purchase the hardware key and use such key to perform the upgrade. The user may therefore realize a cost savings by not fully paying for unused meter functionality until such functionality is needed.

Preserving Measured Data

When converting or upgrading operation modes of a meter as described above, measured data typically is not lost. This result is achieved by storing cumulative billing information in meter EEPROM 34 (FIG 1). More specifically, for all modes of operation, each section of EEPROM 34 is designated to store specific types of information. Regardless of the mode of operation, the EEPROM section assignments do not change. When a mode change occurs, the same information continues to accumulate in the respective assigned EEPROM sections. With such a structure, rather than erasing the measured data, the data simply continues to accumulate in the assigned sections.

For example, after converting from the demand only mode to the TOU mode, demand type information continues to be accumulated in the same EEPROM section used prior to the conversion. Similarly, when converting from the TOU mode to the demand mode, demand type information continues to be accumulated in the same EEPROM section prior to the conversion. Of course, after converting from the TOU mode to the demand mode, TOU information is no longer accumulated for time periods subsequent to the conversion.

In one configuration, some data is cleared when converting from demand to TOU, or from TOU to demand, is stored in one section of EEPROM 34. More specifically, in the demand mode, real time pricing information is stored in this one section. In the TOU mode, Rate A information is stored in this section. This one EEPROM section is cleared as a result of a conversion because different types of information are stored in such section depending upon the particular mode selected. Of course, if extra EEPROM memory storage were available, such data would not necessarily be cleared.

By specifically avoiding the erasure of billing data stored in EEPROM 34, measured data is not substantially lost. Such a structure facilitates easier and faster conversion of the meter without loss of billing data.

From the preceding description of various embodiments of the present invention, it is evident that the objects of the invention are attained. Although the invention has been described and illustrated in detail, it is to be clearly understood that the same is intended by way of illustration and example only and is not to be taken by way of limitation. Accordingly, the spirit and scope of the invention are to be limited only by the terms of the appended claims.

What is claimed is:

1. A microcomputer for an electronic electricity meter, said microcomputer configured to be electrically coupled to an option board, the option board being a high function option board, the meter further including an optical port electrically coupled to the high function option board, said microcomputer configured to:

detect whether the option board has been electrically connected thereto; and if the option board is electrically connected thereto, execute a routine associated with the functionality of the option board, prior to executing the routine associated with the functionality of the option board, the option board being enabled by transmitting an enable signal from an external computer via the optical port to the high function option board.

2. A microcomputer in accordance with claim 1 wherein detecting whether the option board has been electrically connected thereto is performed by checking the status of at least one microcomputer pin.

3. A microcomputer in accordance with claim 1 wherein the high function option board includes recording functionality.

4. A microcomputer in accordance with claim 1 wherein executing the routine associated with the functionality of the option board results in said microcomputer operating as a slave and the high function option board operating as a master.

5. A microcomputer in accordance with claim 1 wherein the functionality of the option board substantially replaces the functionality initially to be executed by said microcomputer.

6. A method for selecting the operation mode of a convertible meter including a microcomputer programmed to selectively operate in at least two modes, an external computer coupled to the microcomputer for establishing a communication link between the computer and the microcomputer, at least one password having been stored in the microcomputer, said method comprising the steps of:

communicating a password from the external computer to the microcomputer via the communications link;

comparing the communicated password with the stored password; and if the comparison results in a first result, then converting meter operation from a first mode to a second mode, the meter mode of operations comprising at least a demand only mode and a time of use mode.

7. A method in accordance with claim 6 wherein a hardware key having an encryption key stored therein is coupled to the external computer, and wherein communicating a password from the external computer to the microcomputer comprises the step of generating the password to be communicated using the encryption key.

8. A method in accordance with claim 7 wherein the hardware key further has at least one counter for indicating the number of conversions which can be authorized by the key, and wherein communicating the password from the external computer to the microcomputer comprises the step of checking whether the counter has a value at least equal to one.

9. A method in accordance with claim 6 wherein the meter has an identification number stored therein, and wherein communicating the password from the external computer to the microcomputer comprises the step of reading the meter identification number and generating the password using the meter identification number and the encryption key.

10. A method in accordance with claim 9 wherein the meter includes status indicators for indicating the current operation mode of the meter, and wherein communicating the password from the external computer to the microcomputer comprises the step of reading the status indicators and generating the password for a selected conversion only if the conversion to be made will not result in converting the meter to the operation mode indicated by the status indicators.

11. A method in accordance with claim 6 wherein the meter has an identification number stored therein and wherein a hardware key having an encryption key stored therein is coupled to the external computer, the hardware key further having at least one counter for indicating the number of conversions which can be authorized by the key and wherein communicating a password from the external computer to the microcomputer comprises the steps of:

reading the meter identification number;

checking whether the counter has a value at least equal to one; and if the counter value is at least equal to one, generating the password to be communicated using the encryption key and the meter identification number.

12. A method in accordance with claim 6 wherein the meter mode of operations further comprises a demand with load profile mode.

13. A method in accordance with claim 6 wherein the first result is a match between the communicated password and the stored password.

14. A method in accordance with claim 6 wherein the conversion of the meter operation from a first mode to a second mode does not result in a significant loss of meter billing data.

15. A method in accordance with claim 6 further comprising the step of if the comparison results in a second result, then not converting meter operation from a first mode to a second mode.

16. In an electronic electricity meter, a microcomputer for performing metering calculations and configured to be electrically coupled to a high function option board, an optical port electrically coupled to the high function option board so that the option board can be enabled by transmitting an enable signal from an external computer via the optical port to the high function option board, said microcomputer configured to:

detect whether the option board has been electrically connected to said microcomputer;

detect whether the option board is enabled; and if the option board is electrically connected to said microcomputer and enabled, execute a routine associated with the functionality of the option board.

17. A microcomputer in accordance with claim 16 wherein the option board is a simple input/output board.

18. A microcomputer in accordance with claim 16 wherein the option board is a simple recording board.

19. A microcomputer in accordance with claim 16 wherein the option board is a combination simple input/output board and a simple recording board.

* * * * *